(12) United States Patent
Chu

(10) Patent No.: US 11,694,466 B2
(45) Date of Patent: Jul. 4, 2023

(54) BIOMETRIC VERIFICATION DEVICE

(71) Applicant: Au Optronics Corporation, Hsinchu (TW)

(72) Inventor: Hsun-Chen Chu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/689,991

(22) Filed: Mar. 9, 2022

(65) Prior Publication Data
US 2022/0375248 A1 Nov. 24, 2022

Related U.S. Application Data

(60) Provisional application No. 63/189,960, filed on May 18, 2021.

(30) Foreign Application Priority Data

Oct. 22, 2021 (TW) .................................. 110139384

(51) Int. Cl.
*G06V 40/13* (2022.01)
*H01L 27/146* (2006.01)
*F21V 8/00* (2006.01)

(52) U.S. Cl.
CPC ............. *G06V 40/13* (2022.01); *G02B 6/003* (2013.01); *H01L 27/14678* (2013.01)

(58) Field of Classification Search
CPC .... G06V 40/13; H01L 27/14678; G02B 6/003
See application file for complete search history.

(56) References Cited

U.S. PATENT DOCUMENTS

2022/0317496 A1* 10/2022 Matsunaga ............ G02B 6/003

FOREIGN PATENT DOCUMENTS

| CN | 110119046 | 8/2019 |
| CN | 110309775 | 10/2019 |
| CN | 111652196 | 9/2020 |
| TW | 202011097 | 3/2020 |

* cited by examiner

*Primary Examiner* — Abdul-Samad A Adediran
(74) *Attorney, Agent, or Firm* — JCIPRNET

(57) ABSTRACT

A biometric verification device includes a backlight module, a photodetector, a switching element, and at least one collimation structure. The photodetector is disposed on the backlight module. The switching element is disposed on the backlight module and electrically connected with the photodetector. The at least one collimation structure is disposed on the backlight module and has a first pinhole and a second pinhole. The horizontal projections of the first pinhole and the second pinhole on the backlight module do not overlap with the horizontal projection of the photodetector on the backlight module.

16 Claims, 8 Drawing Sheets

BIOMETRIC VERIFICATION DEVICE

CROSS-REFERENCE TO RELATED APPLICATION

This application claims the priority benefits of U.S. provisional patent application Ser. No. 63/189,960, filed on May 18, 2021, and Taiwan patent application serial no. 110139384, filed on Oct. 22, 2021. The entirety of each of the above-mentioned patent applications is hereby incorporated by reference herein and made a part of this specification.

FIELD OF THE INVENTION

This invention relates to an optical device, and particularly relates to a biometric verification device.

DESCRIPTION OF RELATED ART

Recently, biometric verification technologies are widely applied to various electronic apparatuses, such as mobile phones and tablet computers, to provide various identity login or identity verification functions. For a backlight fingerprint recognition device, in order to make the fingerprint image clear, the range of the light emission angle has to be limited to decrease the angle of the light being reflected from the finger to the detector and prevent the detector from receiving too much large-angle stray light blurring the image. The current method is attaching a collimation film above the backlight module, but the collimation film not only adds extra cost but also occupies certain space.

SUMMARY OF THE INVENTION

This invention provides a biometric verification device, above which a collimation film is not required to be attached, to decrease the cost and reduce the thickness of device.

According to an embodiment of this invention, the biometric verification device may include a backlight module, a photodetector, a switching element, and at least one collimation structure. The photodetector is disposed on the backlight module. The switching element is disposed on the backlight module and electrically connected with the photodetector. The at least one collimation structure is disposed on the backlight module and has a first pinhole and a second pinhole therein. The horizontal projections of the first pinhole and the second pinhole on the backlight module do not overlap with the horizontal projection of the photodetector on the backlight module.

As mentioned above, the biometric verification device according to an embodiment of this invention includes a collimation structure in replacement of the conventional collimation film, wherein the horizontal projections of the first pinhole and the second pinhole of the collimation structure on the backlight module do not overlap with the horizontal projection of the photodetector on the backlight module. Therefore, as compared with the prior art, the number of the fabrication processes is decreased, and the thickness of device is reduced.

In order to make the above-mentioned features and merits of this invention clearer and more understandable, exemplary embodiments are described in details below in accompany with the attached drawings.

DESCRIPTION OF THE EMBODIMENTS

Figure 1A:
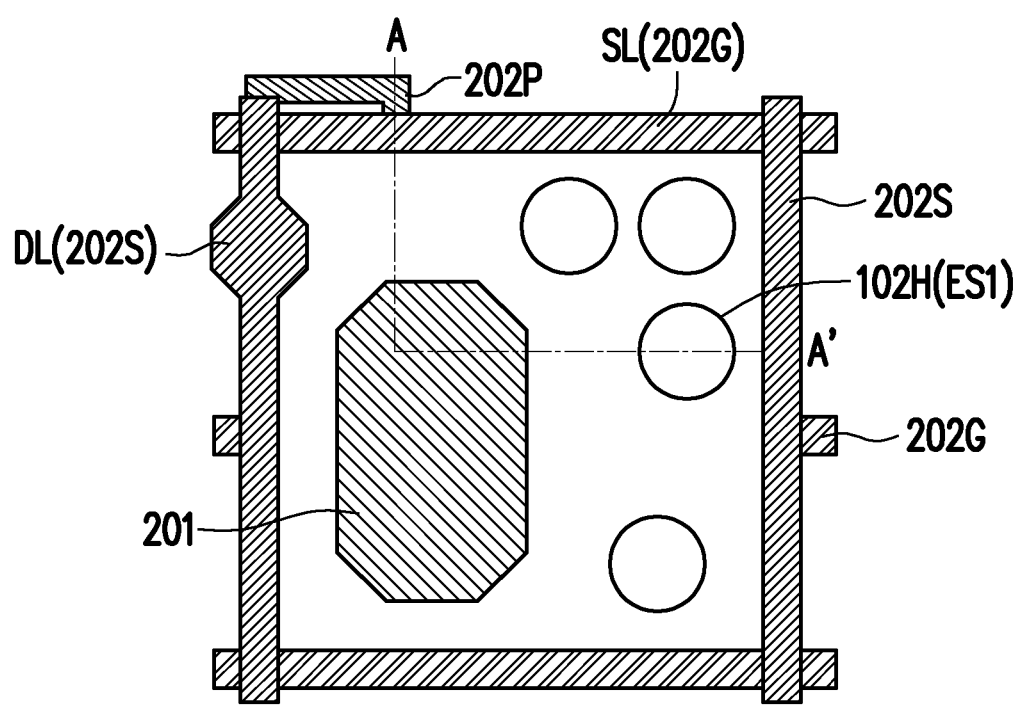
FIG. 1A is a schematic plan view of a pixel of a biometric verification device according to a first embodiment of this invention.
Figure 1B:
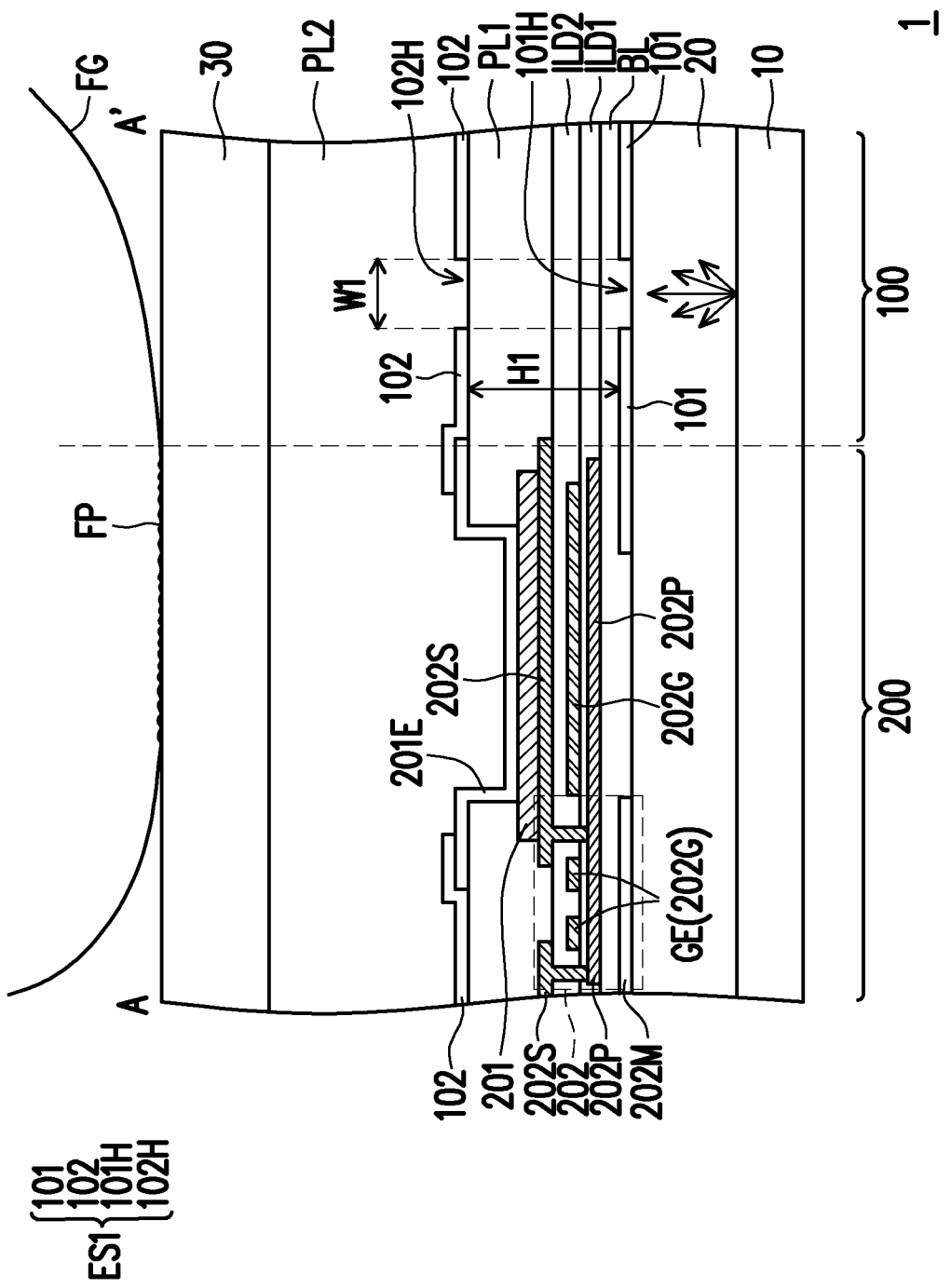
FIG. 1B is a schematic cross-sectional view of a pixel of the biometric verification device according to the first embodiment of this invention.

Referring to FIG. 1A and FIG. 1B, FIG. 1A is a schematic plan view of a pixel of the biometric verification device according to the first embodiment of this invention, and FIG. 1B is a schematic cross-sectional view of the pixel along line A-A' shown in FIG. 1A.

The biometric verification device 1 includes a backlight module 10, a photodetector 201, a switching element 202, and at least one collimation structure ES1, wherein the at least one collimation structure ES1 is arranged in a transmission area 100, and the photodetector 201 and the switching element 202 are arranged in a sensing area 200 that does not overlap with the transmission area 100. The photodetector 201, the switching element 202 and the at least one collimation structure ES1 are all disposed on the backlight module 10. The switching element 202 is electrically connected with the photodetector 201. The number of the collimation structure(s) ES1 is one at least, wherein each collimation structure ES1 has a first pinhole 101H and a second pinhole 102H. As shown in FIG. 1A, each pixel of the biometric verification device 1 may include four collimation structures.

The switching element 202 is defined by patterning a semiconductor layer 202P, a first metal layer 202G and a second metal layer 202S, wherein an interlayer dielectric layer ILD1 or ILD2 is disposed between any adjacent two of the semiconductor layer 202P, the first metal layer 202G and the second metal layer 202S. Because the interlayer dielectric layers ILD1 and ILD2 are disposed between the second metal layer 202S and the semiconductor layer 202P, in order to achieve the required electrical connection, the second metal layer 202S is connected to the semiconductor layer 202P through vias passing through the interlayer dielectric layers ILD1 and ILD2. In addition, the switching element 202 further includes a screening metal layer 202M to prevent the semiconductor layer 202P from being irradiated by the backlight module 10 to be affected in properties thereof.

As shown in FIG. 1B, the backlight module 10 emits plural light beams in different directions, wherein the light beam passing the first pinhole 101H and the second pinhole 102H in sequence and reflected by the finger FG of the user can be incident to the photodetector 201 to allow the biometric verification device 1 to verify the fingerprint FP of the user. Meanwhile, the large-angle light beams also coming from the backlight module 10 are blocked by the collimation structure(s) ES1 and cannot reach the finger FG of the user.

In this embodiment, the first pinhole 101H and the second pinhole 102H are defined by the first collimation layer 101 and the second collimation layer 102, respectively, and the first collimation layer 101 and the second collimation layer 102 may include metal. The screening metal layer 202M is arranged in the same level of the first collimation layer 101 and the first pinhole 101H. The second collimation layer 102 may be electrically connected with a common electrode of the biometric verification device 1 to stabilize the voltage and avoid coupling.

As mentioned above, the biometric verification device 1 provided in this embodiment is formed with at least one collimation structure ES1. Moreover, different from the prior art in which the collimation film/layer is arranged overlapping with the photodetector, the collimation structure(s) ES1 does not overlap with the photodetector 201. Specifically, the horizontal projections of the first pinhole 101H and the second pinhole 102H on the backlight module 10 do not overlap with the horizontal projection of the photodetector 201 on the backlight module 10, and the screening metal layer 202M is arranged in the same level of the first collimation layer 101 and the first pinhole 101H. Thereby, the number of fabrication processes can be decreased, and the thickness of the biometric verification device 1 can be reduced.

In this embodiment, the first pinhole 101H and the second pinhole 102H are round-shaped, and the ratio of the distance H1 between the two pinholes in the normal direction of the first collimation layer 101 to the width W1 of the first pinhole 101H and the second pinhole 102H falls within the range of 5 to 10 to ensure that the first collimation layer 101 and the second collimation layer 102 block large-angle inclined stray light. In this embodiment, the width W1 of the first pinhole 101H and the second pinhole 102H is the diameter of the same.

The biometric verification device 1 also includes a transparent substrate 20, a first planarization layer PL1, a second planarization layer PL2 and a transparent cover plate 30. The transparent substrate 20 is arranged between the backlight module 10 and the first collimation 101. The first planarization layer PL1 is arranged over the second metal layer 202S and the photodetector 201, and the second collimation layer 102 is arranged on the first planarization layer PL1. The second planarization layer PL2 is arranged over the second collimation layer 102. The transparent cover plate 30 is arranged on the second planarization layer PL2 to allow the user to place a finger FG thereon for fingerprint recognition.

The biometric verification device 1 further includes a transparent electrode layer 201E electrically connected with the photodetector 201. The transparent electrode layer 201E is arranged between the first collimation layer 101 and the second collimation layer 102, and is electrically connected to the common electrode via the second collimation layer 102. However, this invention is not limited thereto. In another embodiment of this invention, an insulating layer is arranged between the transparent electrode layer 201E and the second collimation layer 102, and the transparent electrode layer 201E and the second collimation layer 102 are not electrically connected in the sensing area 200 and are respectively electrically connected to the common electrode outside of the sensing area 200. The horizontal projection of the second collimation layer 102 on the backlight module 10 partially overlaps with that of the transparent electrode layer 201E on the backlight module 10. The horizontal projection of the second collimation layer 102 on the backlight module 10 also partially overlaps with that of the photodetector 201 on the backlight module 10, so as to block large-angle inclined stray light and prevent stray light from being incident to the photodetector 201.

Though the switching element 202 as shown in FIG. 1B has dual gate electrodes GE, this invention is not limited thereto. In other embodiments, the switching element 202 have only one gate electrode. In addition, there is storage capacitance between the semiconductor layer 202P arranged under the photodetector 201 and the first metal layer 202G and also between the first metal layer 202G and the second metal layer 202S, and the first collimation layer 101 has therein an opening under the photodetector 201. The horizontal projection of the opening on the backlight module 10 at least partially overlaps with the horizontal projection of the photodetector 201 on the backlight module 10, so as to avoid noise.

In order to fully describe various aspects of this invention, other embodiments of this invention will be described below. It is particularly noted that some reference characters of elements and a part of the contents in the precedent embodiment are applied to the embodiments below, wherein identical reference characters are used to represent identical or similar elements, and descriptions of identical technical contents is omitted. For the descriptions of the omitted parts, reference may be made to the foregoing embodiments.

Figure 2A:
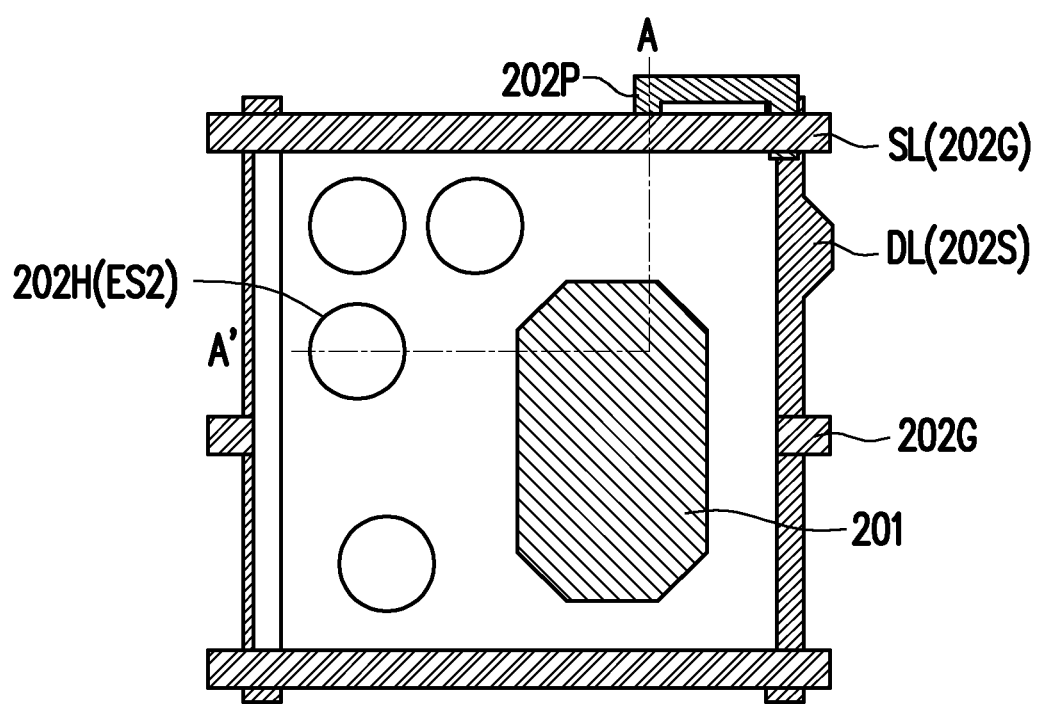
FIG. 2A is a schematic plan view of a pixel of a biometric verification device according to a second embodiment of this invention.
Figure 2B:
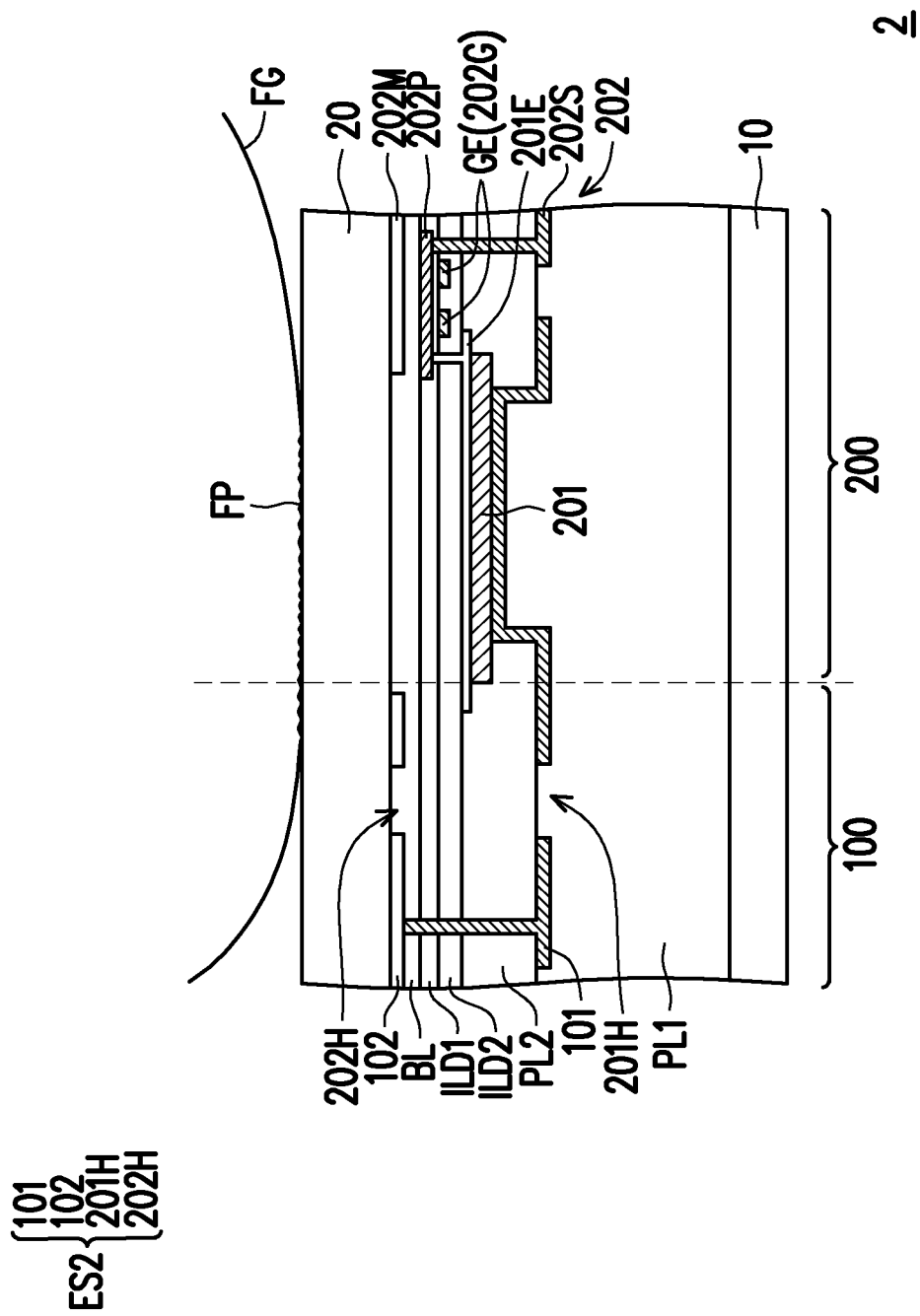
FIG. 2B is a schematic cross-sectional view of a pixel of the biometric verification device according to the second embodiment of this invention.

Referring to FIG. 2A and FIG. 2B, FIG. 2A is a schematic plan view of a pixel of the biometric verification device according to the second embodiment of this invention, and FIG. 2B is a schematic cross-sectional view of the pixel along line A-A' shown in FIG. 2A.

The biometric verification device 2 includes a backlight module 10, a photodetector 201, a switching element 202, and at least one collimation structure ES2. In this embodiment, the first collimation layer 101 and the first pinhole 201H are arranged in the same level of the second metal layer 202S, and the second collimation layer 102 and the second pinhole 202H are arranged in the same level of the screening metal layer 202M of the switching element 202. The first collimation layer 101 and the second collimation layer 102 are electrically connected, and are electrically connected to the common electrode of the biometric verification device 2, so as to stabilize the voltage and prevent coupling.

In this embodiment, the semiconductor layer 202P is arranged between the photodetector 201 and the screening metal layer 202M. A light beam emitted from the backlight module 10 passes the first pinhole 201H and the second pinhole 202H in sequence and is reflected by the finger FG of the user to be incident to the photodetector 201. The screening metal layer 202M is disposed to prevent light reflected by the finger FG of the user from being incident to the semiconductor layer 202P.

The first metal layer 202G (dual gate electrodes GE) and the second metal layer 202S are arranged between the backlight module 10 and the semiconductor layer 202P. The horizontal projection of the first metal layer 202G on the backlight module 10 partially overlaps with that of the semiconductor layer 202P on the backlight module 10, and the horizontal projection of the second metal layer 202S on the backlight module 10 partially overlaps with that of the semiconductor layer 202P on the backlight module 10, so as to prevent the semiconductor layer 202P from being irradiated by the backlight module 10 to change in properties thereof.

In a non-illustrated embodiment of this invention, the horizontal projection of the semiconductor layer 202P on the backlight module 10 may entirely fall within the horizontal projection of both the first metal layer 202G and the second metal layer 202S on the backlight module 10 to utilize both the first metal layer 202G and the second metal layer 202S to more completely block light beams coming from the backlight module 10 and prevent the light beams from being incident to the semiconductor layer 202P.

Figure 3A:
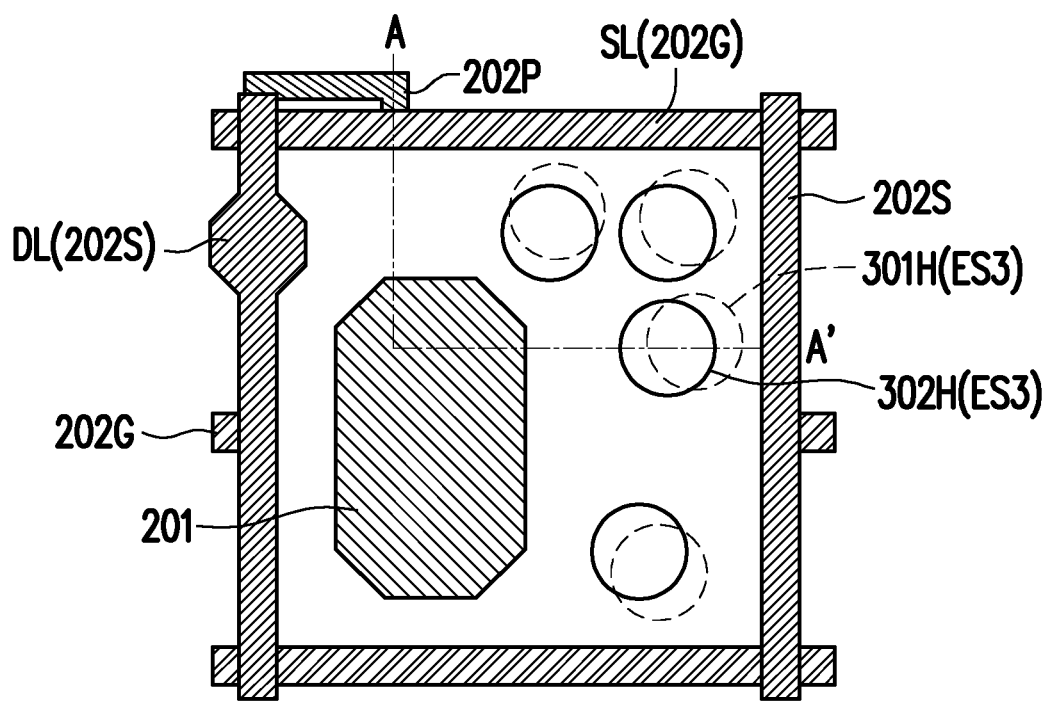
FIG. 3A is a schematic plan view of a pixel of a biometric verification device according to a third embodiment of this invention.
Figure 3B:
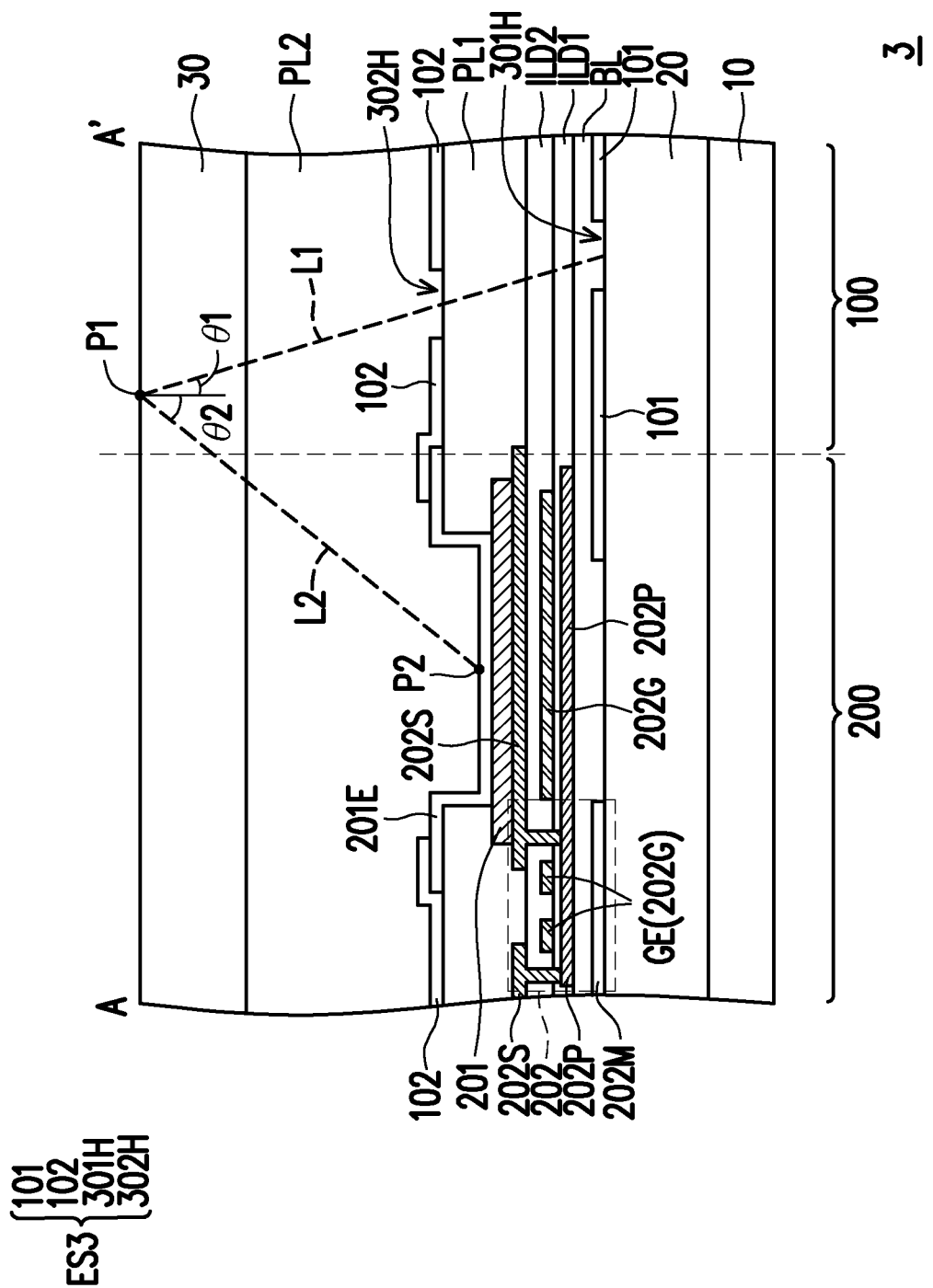
FIG. 3B is a schematic cross-sectional view of a pixel of the biometric verification device according to the third embodiment of this invention.

Referring to FIG. 3A and FIG. 3B, FIG. 3A is a schematic plan view of a pixel of the biometric verification device according to the third embodiment of this invention, and FIG. 3B is a schematic cross-sectional view of the pixel along line A-A' shown in FIG. 3A.

The biometric verification device 3 includes a backlight module 10, a photodetector 201, a switching element 202, and at least one collimation structure ES3. As compared with the biometric verification device 1 as shown FIG. 1A/1B, the collimation structure ES3 in this embodiment includes a first pinhole 301H and a second pinhole 302H, wherein the respective horizontal projections of the two pinholes partially overlap with each other. However, this invention is not limited thereto, and the respective horizontal projections of the first pinhole 301H and the second pinhole 302H may not overlap with each other in other embodiments.

The first pinhole 301H and the second pinhole 302H are round-shaped, and a first angle θ1 between a first imaginary line L1 linking the center of the first pinhole 301H and the center of the second pinhole 302H and the normal line of the first collimation layer 101 falls within the range of 2° to 63° to allow only the inclined light going toward the photodetector 201 to pass and increase the amount of the light reflected from the finger into the photodetector 201.

The first imaginary line L1 intersects with the surface of the transparent cover plate 30 away from the backlight module 10 at an imaginary point P1, and a second angle θ2 between a second imaginary line L2 linking the imaginary point P1 and the geometric center P2 of the photodetector 201 and the normal line of the first collimation layer 101 falls within the range of 2° to 63°.

Figure 4A:
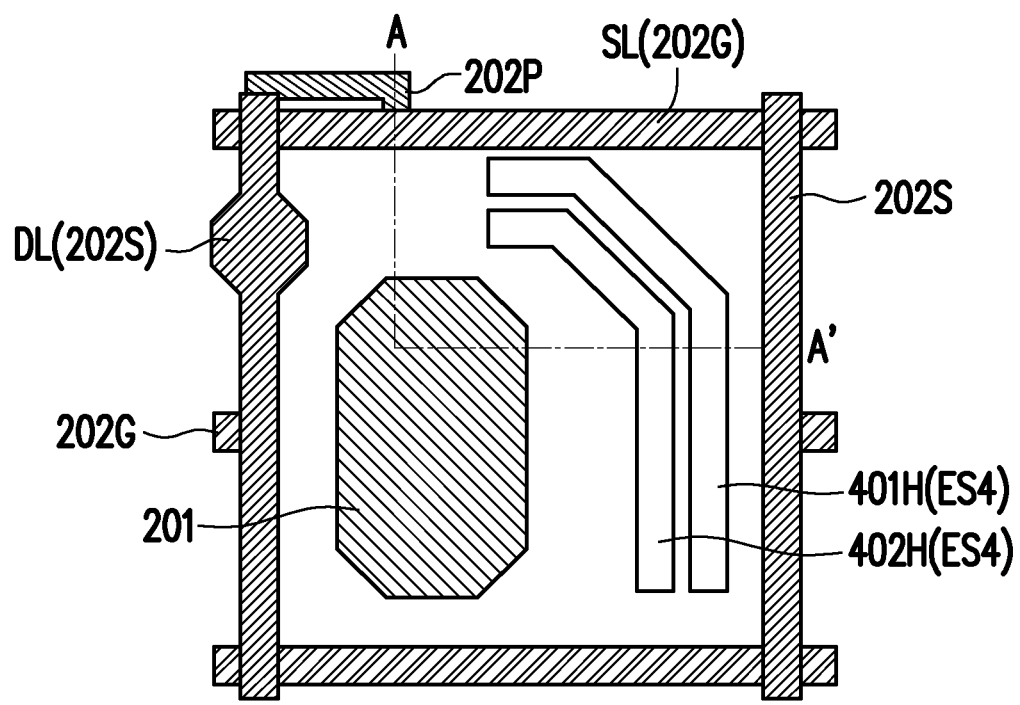
FIG. 4A is a schematic plan view of a pixel of a biometric verification device according to a fourth embodiment of this invention.
Figure 4B:
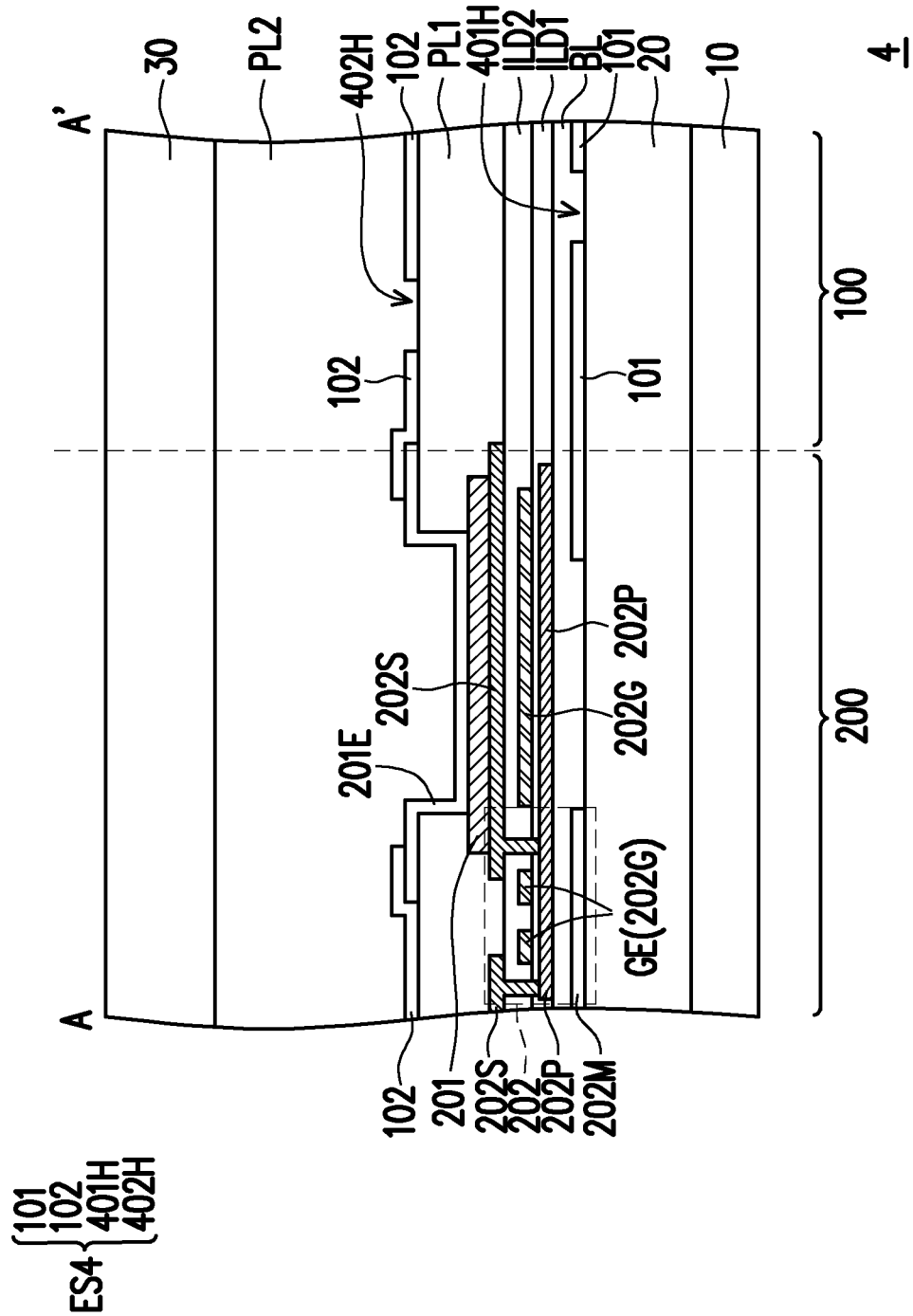
FIG. 4B is a schematic cross-sectional view of a pixel of the biometric verification device according to the fourth embodiment of this invention.

Referring to FIG. 4A and FIG. 4B, FIG. 4A is a schematic plan view of a pixel of the biometric verification device according to the third embodiment of this invention, and FIG. 4B is a schematic cross-sectional view of the pixel along line A-A' shown in FIG. 4A.

The biometric verification device 4 includes a backlight module 10, a photodetector 201, a switching element 202, and a collimation structure ES4. As compared with the biometric verification device 1 as shown in FIG. 1A/1B, the collimation structure ES4 in this embodiment includes a first pinhole 401H and a second pinhole 402H, wherein the respective horizontal projections of the two pinholes do not overlap with each other. The first pinhole 401H and the second pinhole 402H are both strip-shaped, and the strip shapes are conformal to the contour of the side of the photodetector 201 facing the collimation structure ES4. Thus, the photodetector 201 is separated from the first pinhole 401H or the second pinhole 402H by a substantially constant distance in different directions, and uniformity of the light receiving effect of the photodetector 201 in different directions can be controlled.

As mentioned above, the biometric verification devices according to embodiments of this invention include a collimation structure in replacement of the conventional collimation film, wherein the horizontal projections of the first pinhole and the second pinhole of the collimation structure on the backlight module do not overlap with the horizontal projection of the photodetector. Therefore, as compared with the prior art, the number of fabrication processes is decreased and the thickness of device is reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

The invention claimed is:

1. A biometric verification device, comprising:
a backlight module;
a photodetector, disposed on the backlight module;
a switching element, disposed on the backlight module, and electrically connected with the photodetector; and
at least one collimation structure, disposed on the backlight module, and having a first pinhole and a second pinhole therein,
wherein horizontal projections of the first pinhole and the second pinhole on the backlight module do not overlap with a horizontal projection of the photodetector on the backlight module,
wherein the first pinhole and the second pinhole are defined by a first collimation layer and a second collimation layer, respectively, and a ratio of a distance between the first pinhole and the second pinhole in a normal direction of the first collimation layer to a width of one of the first pinhole and the second pinhole falls within a range of 5 to 10.

2. The biometric verification device of claim 1, wherein the switching element comprises a semiconductor layer and a screening metal layer, the screening metal layer is arranged to prevent the semiconductor layer from irradiation of the backlight module, and the screening metal layer and one of the first pinhole and the second pinhole are arranged in a same level.

3. The biometric verification device of claim 1, wherein the first collimation layer and the second collimation layer comprise metal.

4. The biometric verification device of claim 3, wherein the second collimation layer is electrically connected with a common electrode of the biometric verification device.

5. The biometric verification device of claim 3, wherein the first pinhole and the second pinhole are round-shaped, and a first angle between a first imaginary line linking a center of the first pinhole and a center of the second pinhole and a normal line of the first collimation layer falls within a range of 2° to 63°.

6. The biometric verification device of claim 5, further comprising a transparent cover plate, wherein the switching element is arranged between the backlight module and the transparent cover plate, the first imaginary line intersects with a surface of the transparent cover plate away from the backlight module at an imaginary point, and a second angle between a second imaginary line linking the imaginary point and a geometric center of the photodetector and the normal line of the first collimation layer falls within a range of 2° to 63°.

7. The biometric verification device of claim 3, wherein the switching element comprises a first metal layer, a second metal layer and a semiconductor layer, and the first collimation layer and the second metal layer are arranged in a same level.

8. The biometric verification device of claim 7, wherein a horizontal projection of the first metal layer on the backlight module partially overlaps with a horizontal projection of the semiconductor layer on the backlight module, and the first metal layer is arranged between the backlight module and the semiconductor layer.

9. The biometric verification device of claim 7, wherein a horizontal projection of the second metal layer on the backlight module partially overlaps with a horizontal projection of the semiconductor layer on the backlight module, and the second metal layer is arranged between the backlight module and the semiconductor layer.

10. The biometric verification device of claim 7, wherein the switching element further comprises a screening metal layer, and the semiconductor layer is arranged between the photodetector and the screening metal layer.

11. The biometric verification device of claim 7, wherein a horizontal projection of the semiconductor layer on the backlight module entirely falls within a horizontal projection of the first metal layer and the second metal layer on the backlight module.

12. The biometric verification device of claim 3, wherein a horizontal projection of the second collimation layer on the backlight module partially overlaps with the horizontal projection of the photodetector on the backlight module.

13. The biometric verification device of claim 3, further comprising a transparent electrode layer electrically connected with the photodetector, wherein the transparent electrode layer is arranged between the first collimation layer and the second collimation layer, and a horizontal projection of the second collimation layer on the backlight module partially overlaps with a horizontal projection of the transparent electrode layer on the backlight module.

14. The biometric verification device of claim 3, wherein the first collimation layer has an opening therein, and a horizontal projection of the opening on the backlight module at least partially overlaps with the horizontal projection of the photodetector on the backlight module.

15. The biometric verification device of claim 1, wherein each of the first pinhole and the second pinhole has a strip shape, and the strip shape is conformal to at least a part of a contour of the photodetector.

16. The biometric verification device of claim 1, wherein the horizontal projections of the first pinhole and the second pinhole on the backlight module do not overlap with each other.

* * * * *